US007564472B2

(12) United States Patent
Kubo

(10) Patent No.: US 7,564,472 B2
(45) Date of Patent: Jul. 21, 2009

(54) OPTICAL CONTROL APPARATUS

(75) Inventor: Isao Kubo, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 310 days.

(21) Appl. No.: 11/677,728

(22) Filed: Feb. 22, 2007

(65) Prior Publication Data

US 2007/0195156 A1 Aug. 23, 2007

(30) Foreign Application Priority Data

Feb. 23, 2006 (JP) ............................ 2006-046895

(51) Int. Cl.
*B41J 2/44* (2006.01)
*H01S 5/068* (2006.01)

(52) U.S. Cl. ....................... 347/133; 347/246; 347/247; 347/132; 372/38.01; 372/38.02

(58) Field of Classification Search ................. 347/132, 347/133, 233, 236, 237, 246, 247; 372/38.01, 372/38.02

See application file for complete search history.

(56) References Cited

U.S. PATENT DOCUMENTS

| | | | | |
|---|---|---|---|---|
| 5,163,063 | A * | 11/1992 | Yoshikawa et al. | 372/38.02 |
| 7,433,377 | B2 * | 10/2008 | Quinn et al. | 372/38.02 |
| 2004/0264527 | A1 * | 12/2004 | Ochiai et al. | 372/38.1 |

FOREIGN PATENT DOCUMENTS

| | | |
|---|---|---|
| JP | 63-301075 | 12/1988 |
| JP | 09-102646 | 4/1997 |
| JP | 10-125985 | 5/1998 |
| JP | 11-311881 | 11/1999 |
| JP | 2000-326549 | 11/2000 |
| JP | 2001-202645 | 7/2001 |
| JP | 2001-244556 | 9/2001 |
| JP | 2001-253111 | 9/2001 |
| JP | 2003-209320 | 7/2003 |
| JP | 2004-071974 | 3/2004 |

OTHER PUBLICATIONS

Japanese Notice of Reasons of Rejection; Application No. 2006-046895; Reference No. PBRO2866; Mailed Mar. 10, 2009.

* cited by examiner

*Primary Examiner*—Huan H Tran
(74) *Attorney, Agent, or Firm*—Banner & Witcoff, Ltd

(57) ABSTRACT

In an optical control apparatus, a semiconductor laser emits a laser beam having a power corresponding to an energizing current. A light power detecting device detects a light power of the laser beam. A monitor voltage generating device generates a monitor voltage set based on the light power. A reference voltage generating device generates a reference voltage set based on a target light power of the laser beam. A current control device controls the energizing current such that the monitor voltage approaches the reference voltage based on a deviation of the monitor voltage from the reference voltage. A pseudo voltage input device inputs a predetermined pseudo voltage to the current control device instead of the monitor voltage under a predetermined condition such that a variation range of the deviation lies within a predetermined range.

17 Claims, 6 Drawing Sheets

OPTICAL CONTROL APPARATUS

CROSS-REFERENCE TO RELATED APPLICATIONS

This application claims the benefit of Japanese Patent Application No. 2006-46895 filed Feb. 23, 2006 in the Japan Patent Office, the disclosure of which is incorporated herein by reference.

BACKGROUND

The present invention relates to an optical control apparatus which energizes a semiconductor laser for emission of a laser beam from the semiconductor laser, and more particularly to an optical control apparatus which controls energizing current for the semiconductor laser to adjust the light power of the laser beam to a target light power.

A known image forming apparatus which forms an image by an electrophotographic method such as a laser printer includes a semiconductor laser as a light source used for exposing a photosensitive body. This type of image forming apparatus requires adjustment of the light power of a laser beam to a predetermined power so as to obtain a desired concentration of a formed image.

According to a proposed technique, the light power of a laser beam is kept constant under the control over energizing current for a semiconductor laser by monitoring the light power of the laser beam from the semiconductor laser through the use of a photodetector and comparing the monitoring result after sample hold and a laser power reference voltage.

SUMMARY

However, components such as a sample hold circuit for conducting sample hold of the monitoring result and an operational amplifier for carrying out the comparison included in this structure have certain time constants. Thus, when a reference voltage corresponding to a target light power is established immediately at the start of the semiconductor laser, a light power overshoot of a laser beam is caused during control in some cases since the difference between the monitoring result and the target light power is great.

It is possible to avoid the light power overshoot by gradually bringing the reference voltage close to the value corresponding to the target light power. In this case, however, the reference voltage needs to be increased extremely slowly and therefore a longer time is required. In addition, a similar problem of light power undershoot occurs in the toner save mode for saving toner or in other cases where the light power is decreased.

In case of an optical control apparatus which energizes a semiconductor laser for emission of a laser beam from the semiconductor laser, it is desirable that the optical control apparatus can adjust the light power of the laser beam in a short time while prohibiting light power overshoot and light power undershoot.

It is preferable that an optical control apparatus according to the invention includes a semiconductor laser, a light power detecting device, a monitor voltage generating device, a reference voltage generating device, a current control device, and a pseudo voltage input device.

The semiconductor laser emits a laser beam having a power corresponding to an energizing current. The light power detecting device detects a light power of the laser beam. The monitor voltage generating device generates a monitor voltage set based on the light power detected by the light power detecting device. The reference voltage generating device generates a reference voltage set based on a target light power of the laser beam. The current control device controls the energizing current for the semiconductor laser such that the monitor voltage approaches the reference voltage based on a deviation of the monitor voltage from the reference voltage. The pseudo voltage input device inputs a predetermined pseudo voltage to the current control device instead of the monitor voltage under a predetermined condition such that a variation range of the deviation, caused by a change of the reference voltage between before and after a setting of the target light power, lies within a predetermined range.

BRIEF DESCRIPTION OF THE DRAWINGS

The invention will now be described below, by way of example, with reference to the accompanying drawings, in which.

DESCRIPTION OF THE PREFERRED EMBODIMENT

Figure 1:
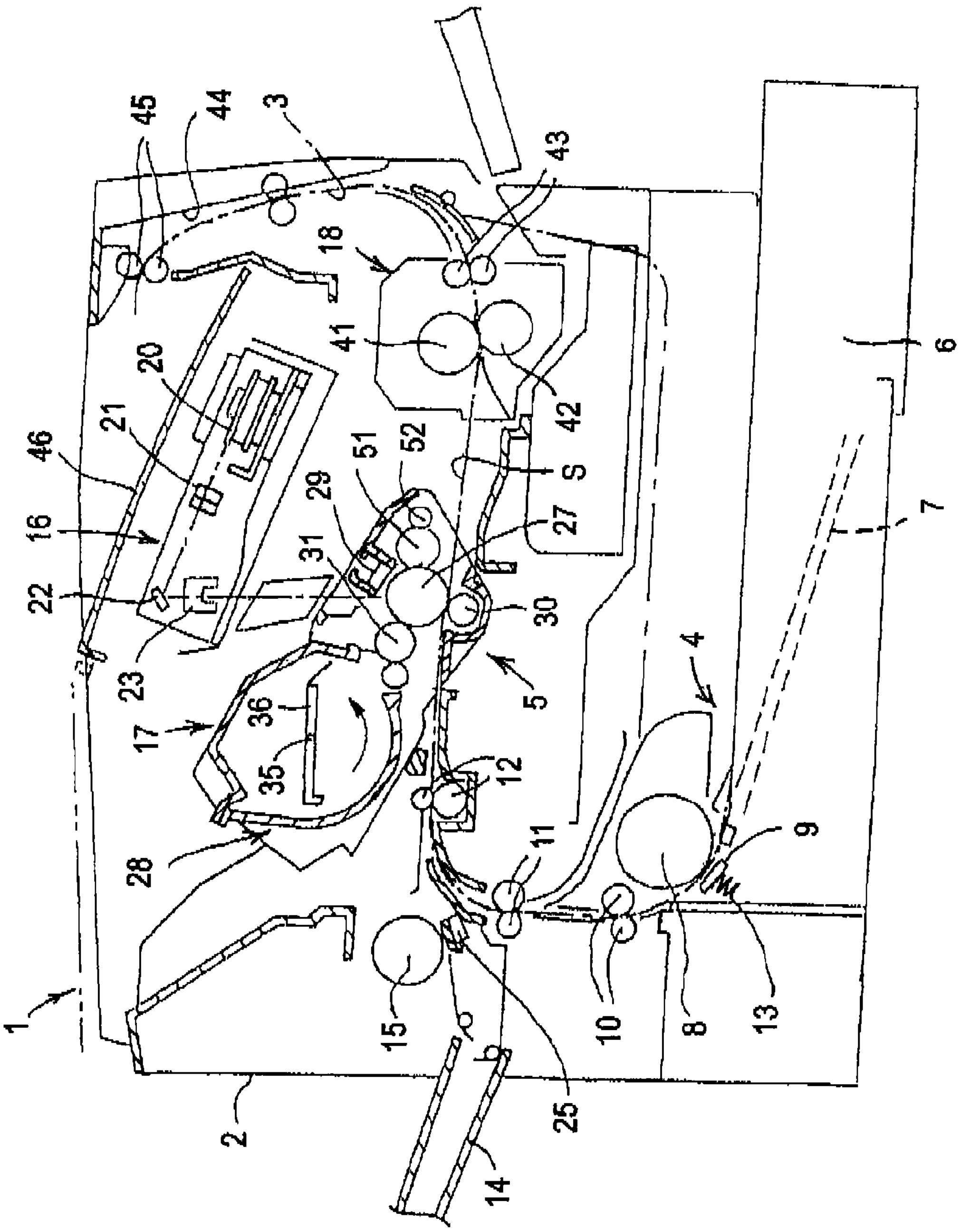
FIG. 1 is a cross-sectional view schematically showing a structure of a laser printer according to the invention.

As illustrated in FIG. 1, the laser printer 1 includes a feeder unit 4 for feeding a paper 3 as a recording medium, the image forming unit 5 for forming an image on the paper 3 fed by the feeder unit 4, and other components within a main body case 2.

The feeder unit 4 has a paper tray 6, a paper pressing plate 7, a feed roller 8, a feed pad 9, paper dust removing rollers 10, conveyance rollers 11, and registration rollers 12. The paper tray 6 is detachably attached to a bottom portion in the main body case 2. The paper pressing plate 7 is disposed inside the paper tray 6. The feed roller 8 and the feed pad 9 are disposed above one end of the paper tray 6. The paper dust removing rollers 10 and the conveyance rollers 11 are disposed downstream from the feed roller 8 in a conveyance direction of the paper 3. The registration rollers 12 are disposed downstream from the conveyance rollers 11 in the conveyance direction of the paper 3.

A plurality of sheets of the paper 3 can be stacked in lamination on the paper pressing plate 7. The end of the paper pressing plate 7 away from the feed roller 8 is supported such that the paper pressing plate 7 can swing, and thus the other end of the paper pressing plate 7 near the feed roller 8 can move upward and downward. Also, the other end of the paper pressing plate 7 is urged upward from its back by a not-shown spring. Thus, as the stack amount of the paper 3 increases, the paper pressing plate 7 swings downward against the urging force of the spring with the fulcrum located at the end away from the feed roller 8. The feed roller 8 and the feed pad 9 are opposed to each other, and the feed pad 9 is pressed onto the feed roller 8 by a spring 13 disposed at the back of the feed pad 9.

A sheet of the paper 3 at the uppermost position on the paper pressing plate 7 is pressed onto the feed roller 8 by the spring from the back of the paper pressing plate 7. Then, the paper 3 is sandwiched between the feed roller 8 and the feed pad 9 by the rotation of the feed roller 8, wherefrom the paper 3 is supplied sheet by sheet. The paper dust on the supplied paper 3 is removed by the paper dust removing rollers 10, and thereafter the supplied paper 3 is sent to the registration rollers 12 by the conveyance rollers 11. The registration rollers 12, constituted by a pair of rollers, convey the supplied paper 3 to an image forming position after performing a predetermined registration of the supplied paper 3. The image forming position herein refers to the position where a toner image is transferred to the paper 3, and corresponds to the contact position between a photosensitive drum 27 and a transfer roller 30 in this embodiment.

The feeder unit 4 further includes a multi-purpose tray 14, and a multi-purpose feed roller 15 and a multi-purpose feed pad 25 for supplying the paper 3 stacked on the multi-purpose tray 14, The multi-purpose feed roller 15 and the multi-purpose feed pad 25 are opposed to each other, and the multi-purpose feed pad 25 is pressed onto the multi-purpose feed roller 15 by a spring provided at the back of the multi-purpose feed pad 25. The paper 3 stacked on the multi-purpose tray 14 is sandwiched between the multi-purpose feed roller 15 and the multi-purpose feed pad 25 by the rotation of the multi-purpose feed roller 15, and is supplied sheet by sheet to the registration rollers 12.

The image forming unit 5 has a scanner unit 16, a processing unit 17, a fixing unit 18, and other parts. The scanner unit 16 is disposed in the upper area inside the main body case 2 below the lower surface of a discharge tray 46. The scanner unit 16 has a laser diode unit 19 (see FIG. 3), a polygon mirror 20 rotated by driving force, lenses 21 and 23, a reflection mirror 22, and other components. In the scanner unit 16, a laser beam emitted from a laser diode LD (see FIG. 4) as a semiconductor laser accommodated in the laser diode unit 19 pass through or reflect on the polygon mirror 20, the lens 21, the reflection mirror 22, and the lens 23 in this order as indicated by a chain line, thereby scan-exposing the surface of the photosensitive drum 27 as a photosensitive body in the processing unit 17.

Figure 2:
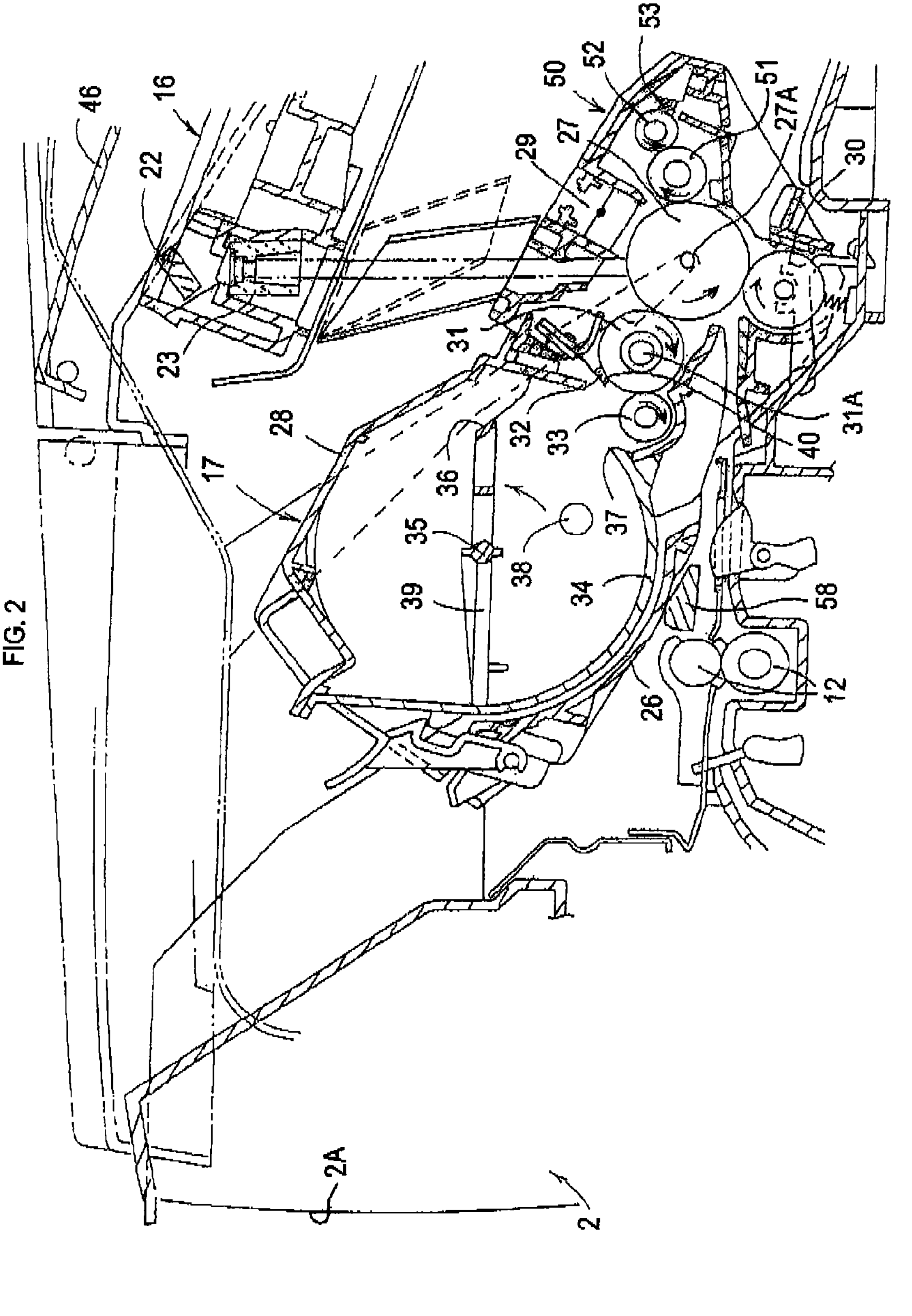
FIG. 2 is an enlarged cross-sectional side view showing a main part of an image forming unit in the laser printer.

As illustrated in FIG. 2, the processing unit 17 has the photosensitive drum 27, a scorotron-type charger 29, the transfer roller 30, a paper dust cleaner 50, and other components in a drum cartridge 26 as a photosensitive unit. The paper dust cleaner 50 has a cleaning roller 51, a secondary roller 52, and a sliding member 53.

In the laser printer 1, residual toner, remaining on the surface of the photosensitive drum 27 after transfer of toner on the photosensitive drum 27 onto the paper 3 by the transfer roller 30, is collected by a so-called cleanerless method using a development roller 31. Since residual toner on the surface of the photosensitive drum 27 is collected by the cleanerless method, the necessity for providing a residual toner cleaner such as a blade or a waste toner storage unit can be eliminated. Accordingly, the structure of the apparatus (the laser printer 1) can be simplified and miniaturized, and the cost thereof can be reduced.

The photosensitive drum 27 is disposed on the side of the development roller 31 as a development unit in such a position as to be opposed to the development roller 31 and rotatable in a direction indicated by an arrow (counterclockwise in FIG. 2). A drum main body of the photosensitive drum 27 is grounded. A surface portion of the photosensitive drum 27 is constituted by a positively chargeable photosensitive layer made of amorphous silicone such as α-Si:H, cadmium sulfide such as CdS, zinc oxide such as ZnO, selenium such as $AsSe_3$, or organic photosensitive material including polycarbonate, for example. A rotation center shaft 27A as a driving shaft of the photosensitive drum 27 projects from right and left sides of the drum cartridge 26, and rotated by driving force from a not-shown main motor.

The scorotron-type charger 29 as a charging unit is disposed above the photosensitive drum 27 with a clearance therebetween in such a position as not to contact the photosensitive drum 27. The scorotron-type charger 29 is a positively charging scorotron-type charger which produces corona discharge from a charging wire such as a tungsten wire. The scorotron-type charger 29 uniformly and positively charges the surface of the photosensitive drum 27, and the charging power is turned on and off by a charging power source.

After uniformly and positively charged by the scorotron-type charger 29 in accordance with the rotation of the photosensitive drum 27, the surface of the photosensitive drum 27 is exposed by high-speed scan of the laser beam emitted from the scanner unit 16, As a result, an electrostatic latent image corresponding to image data is formed on the photosensitive drum 27.

The transfer roller 30 is disposed under the photosensitive drum 27 in such a position as to be opposed to the photosensitive drum 27. The transfer roller 30 is supported in such a manner as to be rotatable in a direction indicated by an arrow (clockwise in FIG. 2). The transfer roller 30 has a metal roller shaft, and a roller made of ion-conductive rubber. This roller made of ion-conductive rubber is covering the roller shaft. At the time of toner transfer, transfer bias (transfer forward bias) generated from a transfer bias applying power source is applied to the transfer roller 30. Thus, a visible image carried on the surface of the photosensitive drum 27 is transferred to the paper 3 while the paper 3 is passing between the photosensitive drum 27 and the transfer roller 30.

A development cartridge 28 as a development unit is detachably attached to the drum cartridge 26. The development cartridge 28 has the development roller 31, a layer thickness regulating blade 32, a supply roller 33, a toner box 34, and other components. The toner box 34 is filled with positively chargeable toner of one non-magnetic component as developer. The toner is constituted by polymer toner produced by copolymerizing polymeric monomer such as styrene or other styrene monomer, or acrylic monomer such as acrylic acid, alkyl (C1 through C4) acrylate, and alkyl. (C1 through C4) methacrylate by a known polymerizing method such as suspension polymerization. The polymer toner has a spherical shape and excellent fluidity. Also, coloring agent such as carbon black, wax or the like is mixed with the toner, and external application additive such as silica is added to the toner so as to increase its fluidity. The particle diameter of the toner is in the range from about 6 μm to about 10 μm.

The toner contained in the toner box 34 is stirred by the rotation of an agitator 36 in a direction indicated by an arrow (counterclockwise in FIG. 2). The agitator 36 is supported by a rotation shaft 35 provided at the center of the toner box 34. The toner is then released through a toner supply port 37 opening on the side of the toner box 34. A window 38 is provided on the side wall of the toner box 34 for the detection of the residual toner amount. The window 38 is cleaned by a cleaner 39 supported by the rotation shaft 35.

The supply roller 33 is disposed adjacent to the toner supply port 37 such that the supply roller 33 can rotate in a direction indicated by an arrow (clockwise in FIG. 2). The development roller 31 is opposed to the supply roller 33 such that the development roller 31 can rotate in a direction indicated by an arrow (clockwise in FIG. 2). The supply roller 33 and the development roller 31 contact each other so as to be compressed to a certain degree due to the contact.

The supply roller 33 has a metal roller shaft covered with a roller made of conductive foam material. The development roller 31 has a metal roller shaft 31A covered with a roller made of conductive rubber. More specifically, the roller of the development roller 31 has a roller main body made of conductive urethane rubber or conductive silicone rubber containing carbon particulates or the like. The surface of the roller main body is covered by a coating layer made of urethane rubber or silicone rubber containing fluorine. Development bias generated from a not-shown development bias applying power source is applied to the development roller 31.

The layer thickness regulating blade 32 is provided in the vicinity of the development roller 31. The layer thickness regulating blade 32 has a blade main body constituted by a metal plate spring material, and a pressing portion 40. The pressing portion 40 has a semicircular cross-sectional shape and is made of insulating silicone rubber. The pressing portion 40 is provided at the tip of the blade main body. The layer thickness regulating blade 32 is supported by the development cartridge 28 in the vicinity of the development roller 31, and the pressing portion 40 contacts the development roller 31 with pressure by the elastic force of the blade main body.

The toner released through the toner supply port 37 is supplied to the development roller 31 by the rotation of the supply roller 33. At this time, the toner is positively friction-charged between the supply roller 33 and the development roller 31. Then, the toner supplied onto the development roller 31 enters between the pressing portion 40 of the layer thickness regulating blade 32 and the development roller 31 by the rotation of the development roller 31, where the toner is further sufficiently friction-charged, As a result, the toner is carried on the development roller 31 as a thin layer having a constant thickness.

Subsequently, when the toner carried and positively charged on the development roller 31 reaches a position opposed to the photosensitive drum 27 and comes into contact therewith by the rotation of the development roller 31, the toner adheres to the electrostatic latent image formed on the surface of the photosensitive drum 27, i.e., a portion exposed by the laser beam and thus having reduced potential on the surface of the photosensitive drum 27 uniformly and positively charged. As a result, the toner is selectively carried on the portion exposed by the laser beam and therefore formed into a visible image.

As illustrated in FIG. 1, the fixing unit 18 is disposed next to the processing unit 17 and downstream therefrom. The fixing unit 18 has a heating roller 41, a pressing roller 42 for pressing the heating roller 41, and a pair of conveyance rollers 43 disposed downstream from the heating roller 41 and the pressing roller 42. The heating roller 41 has a metal halogen lamp for heating. The heating roller 41 thermally fixes the toner transferred on the paper 3 in the processing unit 17 while the paper 3 is passing between the heating roller 41 and the pressing roller 42. Then, the paper 3 is conveyed to a discharge path 44 by the conveyance rollers 43. The paper 3 sent to the discharge path 44 is further conveyed by discharge rollers 45, thereafter the paper 3 is discharged onto the discharge tray 46 by the discharge rollers 45.

Figure 3:
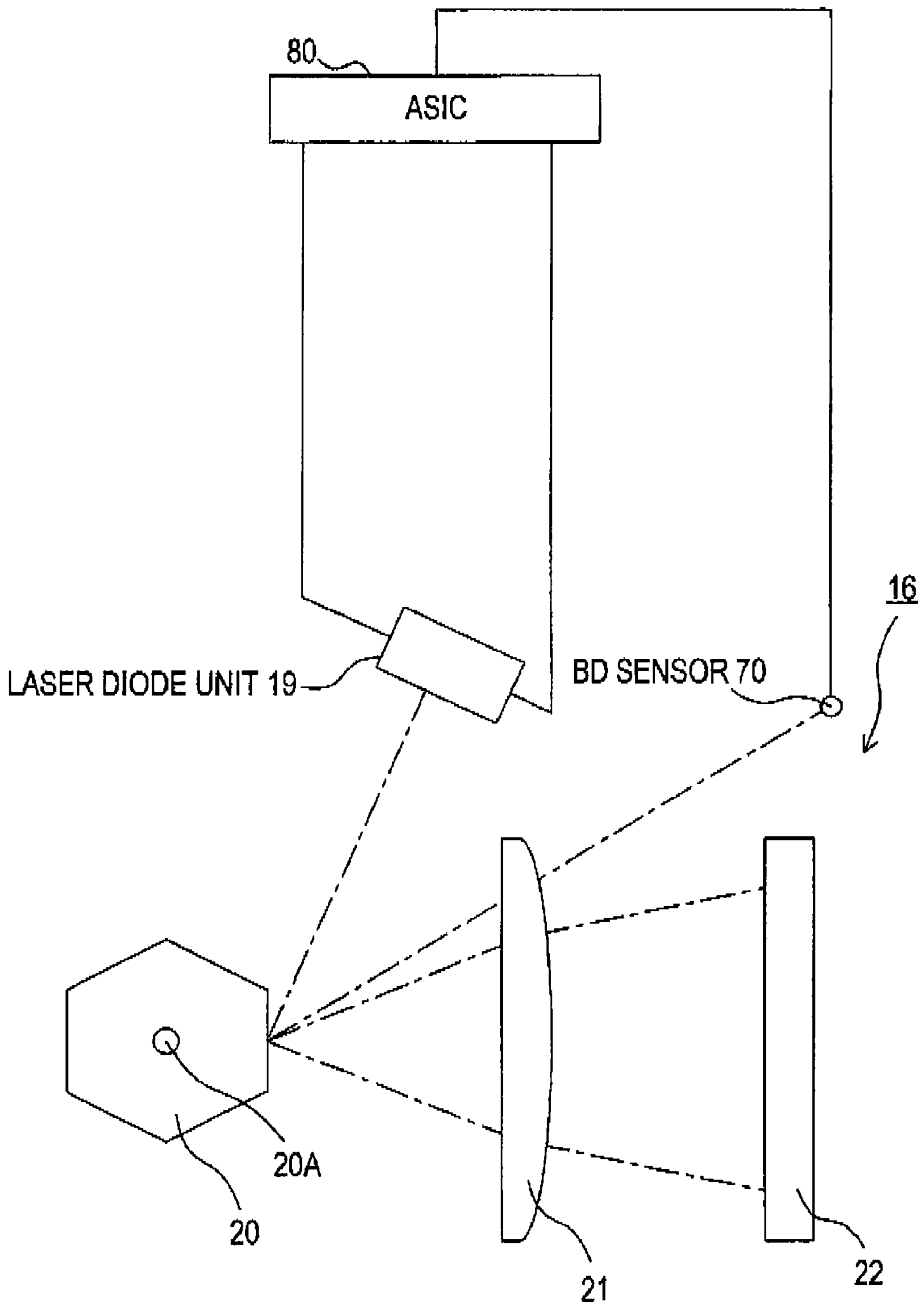
FIG. 3 is an explanatory view of a scanner unit included in the laser printer.

The structure of the scanner unit 16 is now described. As illustrated in FIG. 3, the polygon mirror 20 is rotated by a not-shown polygon motor around a rotation shaft 20A. The laser beam emitted from the laser diode unit 19 scans in the axial direction (main scanning direction) of the photosensitive drum 27 in accordance with the rotation of the polygon mirror 20. Through the lens 21, the reflection mirror 22 and other components, the laser beam reaches the surface of the photosensitive drum 27 as described above. A BD sensor 70 for detecting a scan origin is provided at one end of the scanning range of the laser beam (this end is positioned out of an image forming range). A detection signal by the BD sensor 70 is inputted to the ASIC 80, and the laser diode unit 19 is controlled by the ASIC 80 by the following method.

Figure 4:
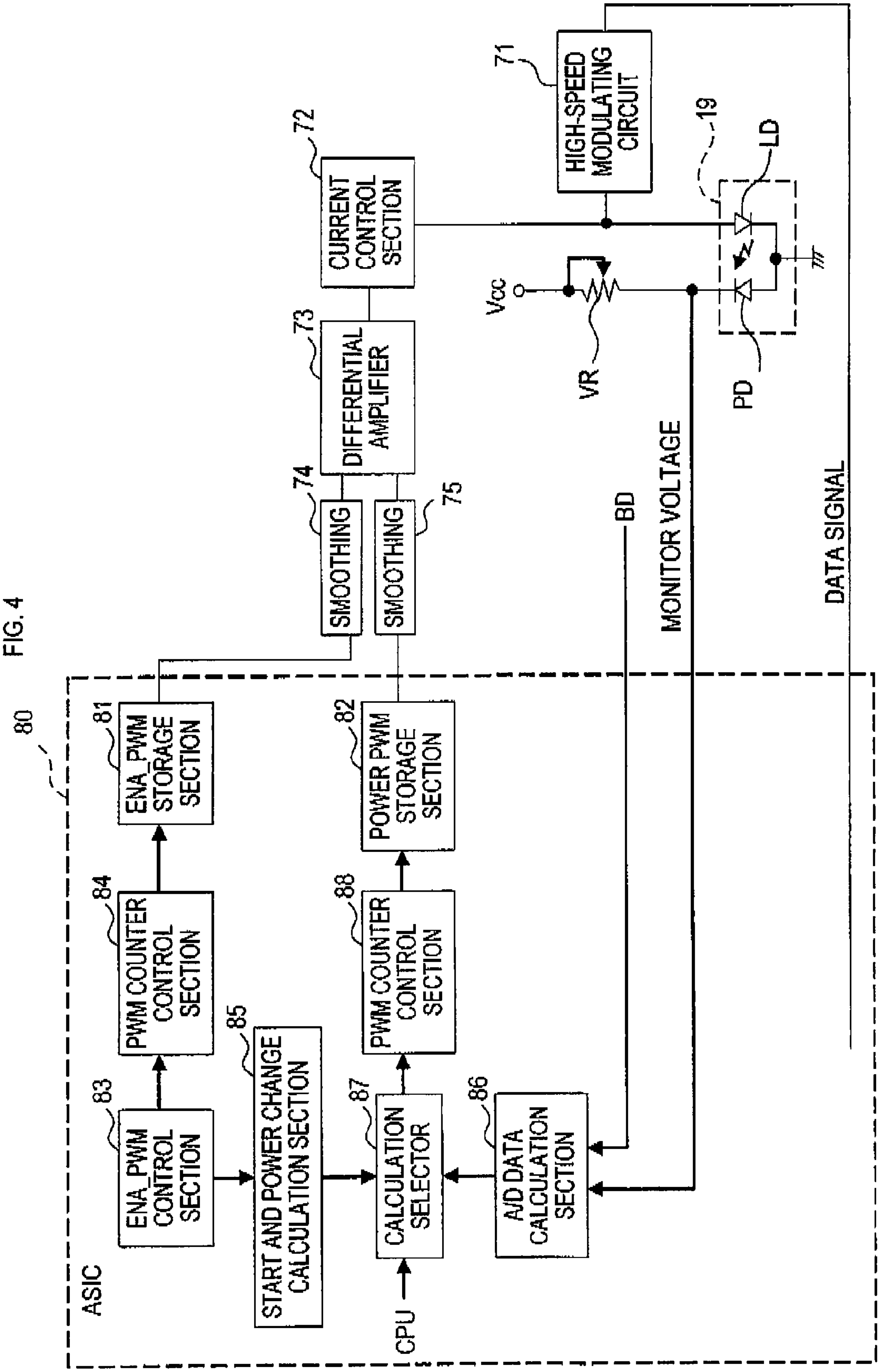
FIG. 4 is a block diagram showing a control system of the scanner unit.

FIG. 4 is a block diagram showing a structure of a control system of the scanner unit 16 including the ASIC 80. As illustrated in FIG. 4, the laser diode unit 19 accommodates the laser diode LD as an example of a semiconductor laser for emitting a laser beam, and a photo diode PD for detecting the power of the laser beam emitted from the laser diode LD.

The cathode of the photo diode PD is connected to an A/D input port of the ASIC 80, and to a power source Vcc via a variable resistor VR. The anode of the photo diode PD and the cathode of the laser diode LD are grounded. Thus, the cathode voltage of the photo diode PD corresponds to the light power of the laser beam emitted from the laser diode LD. This voltage is inputted to the ASIC 80 as monitor voltage.

A high-speed modulating circuit 71 and a current control section 72 are connected to the anode of the laser diode LD. The high-speed modulating circuit 71 selects insulation or short circuit between the anode of the laser diode LD and a ground in accordance with a data signal (printing signal) inputted from the ASIC 80. The current control section 72 controls driving current for the laser diode LD. Thus, when the high-speed modulating circuit 71 is in the condition of insulation, the driving current energizes the laser diode LD and the laser diode LD is thus turned on. When the high-speed modulating circuit 71 is in the condition of short circuit, most of the driving current outputted from the current control section 72 flows to the ground via the high-speed modulating circuit 71, and thus the laser diode LD is turned off, The current control section 72 is connected with a differential amplifier 73. A voltage produced by smoothing a PWM signal outputted from an ENA_PWM storage section 81 of the ASIC 80 (hereinafter abbreviated as an "ENA_PWM signal") by a smoothing circuit 74, and a voltage produced by smoothing a PWM signal outputted from a power PWM storage section 82 (hereinafter abbreviated as a "PWR_PWM signal") by a smoothing circuit 75, are inputted to the differential amplifier 73. The detailed structures of the differential amplifier 73 and the current control section 72 will be described later.

Next, the structure of the ASIC 80 is described. The ENA_PWM control section 83 included in the ASIC 80 inputs a digital value corresponding to a target light power of the laser diode LD (hereinafter referred to as a "reference set value") to a PWM counter control section 84. At the time of setting the target light power such as the time of startup or the time of change of the target light power after the startup, the ENA_PWM control section 83 outputs not a reference set value corresponding to the target light power immediately but a reference set value which gradually approaches a value corresponding to the target light power.

The PWM counter control section 84 converts the reference set value into a PWM signal (an ENA_PWM signal) and inputs the ENA_PWM signal to the ENA_PWM storage section 81. The ENA_PWM storage section 81 constantly outputs the ENA_PWM signal to the smoothing circuit 74. The smoothing circuit 74 smoothes the received ENA_PWM signal to produce an analog voltage corresponding to the reference set value (hereinafter referred to as an "ENA smoothed voltage"), The reference set value outputted from the ENA_PWM control section 83 is also inputted to a start and power change calculation section 85. The start and power change calculation section 85 outputs a predetermined pseudo voltage under a predetermined condition such that a variation range of the difference between a "PWR smoothed voltage" and the "ENA smoothed voltage" caused by a change of the reference set value between before and after a setting of the target light power lies within a predetermined range. The details of the "PWR smoothed voltage" will be described later.

More specifically, in this embodiment, the start and power change calculation section 85 outputs pseudo voltage (digital value) obtained by subtracting a predetermined value from the reference set value at startup of the laser printer 1.

At a change of the target light power of the laser diode LD in such a case as a mode change to a toner save mode, the start and power change calculation section 85 outputs pseudo voltage obtained by adding a predetermined value to a newly set reference set value when the newly set reference set value is decreased from a reference set value just before the change of the target light power. The start and power change calculation section 85 outputs a pseudo voltage obtained by subtracting a predetermined value from a newly set reference set value when the newly set reference set value is increased from a reference set value just before the change of the target light power.

An A/D data calculation section 86 converts a detection signal of the BD sensor 70 (analog voltage corresponding to a light power received at the BD sensor 70) and the monitor voltage described above into digital values. A calculation selector 87 inputs the following digital value to a PWM counter control section 88 based on the monitor voltage converted into the digital value. When the deviation of the monitor voltage (digital value) inputted by the A/D data calculation section 86, from a monitor voltage corresponding to the target light power, lies within a predetermined range, the calculation selector 87 inputs the monitor voltage inputted by the AID data calculation section 86 to the PWM counter control section 88 as a monitor value. When this deviation is out of the predetermined range, the calculation selector 87 inputs the pseudo voltage (digital value) outputted from the start and power change calculation section 85 to the PWM counter control section 88 as a monitor value.

At startup of the laser printer 1, the detection signal of the BD sensor 70 is not inputted to the ASIC 80 until the light power of the laser diode LD reaches or exceeds a predetermined value. In this embodiment, the BD sensor 70 does not detect a laser beam until the light power of the laser diode LD is increased to reach or exceed a predetermined level after the startup of the laser printer 1.

Thus, at the time of startup, the calculation selector 87 may input to the PWM counter control section 88 the pseudo voltage as a monitor value before the detection signal from the BD sensor 70 is inputted. The calculation selector 87 may input the monitor voltage (as a monitor value) inputted from the A/D data calculation section 86 after the detection signal from the BD sensor 70 is inputted.

In this case, the following control can be performed after the detection signal from the BD sensor 70 is inputted. Specifically, when the high-speed modulating circuit 71 is in the condition of insulation, the calculation selector 87 may input the monitor voltage currently inputted from the A/D data calculation section 86 to the PWM counter control section 88. When the high-speed modulating circuit 71 is in the condition of short circuit, the calculation selector 87 may input the monitor voltage, having been inputted from the A/D data calculation section 86 at the time when the high-speed modulating circuit 71 is in the condition of insulation just before the present condition, to the PWM counter control section 88.

The PWM counter control section 88 converts the monitor value inputted from the calculation selector 87 into the PWM signal (PWR_PWM signal) and inputs the PWR_PWM signal to the power PWM storage section 82. The power PWM storage section 82 constantly outputs the received PWR_PWM signal to the smoothing circuit 75. Then, the smoothing circuit 76 smoothes the PWR_PWM signal to convert the PWR_PWM signal into an analog voltage corresponding to the monitor voltage or the pseudo voltage (hereinafter this analog voltage is referred to as a "PWR smoothed voltage").

Figure 5:
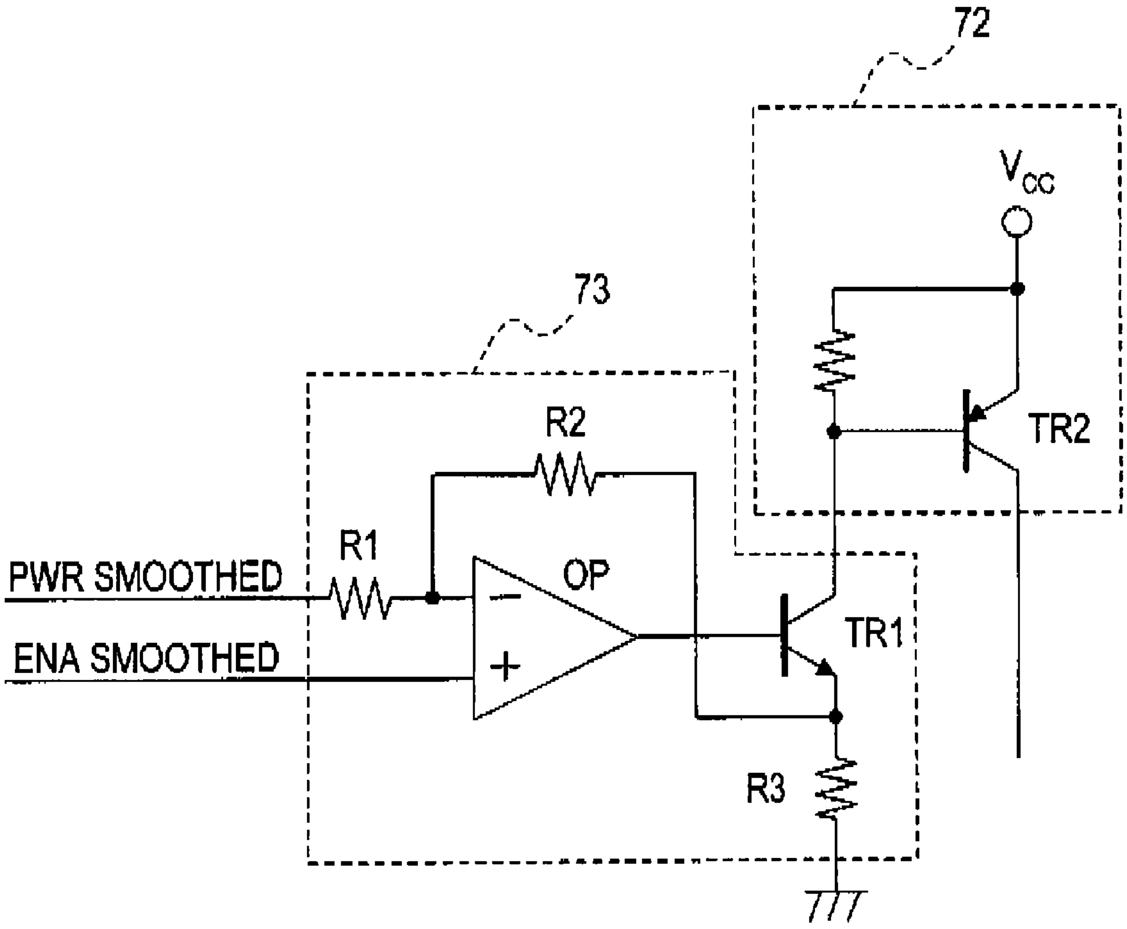
FIG. 5 is a circuit diagram showing a part of the control system in detail.

Next, the structures of the differential amplifier 73 and the current control section 72 are explained in detail with reference to FIG. 5. For simplifying the explanation, the positions of the "PWR smoothed voltage" and the "ENA smoothed voltage" are reversed from those positions shown in FIG. 4 in the up-and-down direction. As illustrated in FIG. 5, the differential amplifier 73 has an operational amplifier OP, and the voltage produced by smoothing the PWR_PWM signal by the smoothing circuit 75 (PWR smoothed voltage) is applied to a reverse input terminal of the operation amplifier OP via a resistor R1. This reverse input terminal is connected to an emitter of a transistor TR1 via a resistor R2, and grounded via a resistor R3. The transistor TR1 is a NPN-type transistor controlled by an output of the operational amplifier OP.

The voltage produced by smoothing the ENA_PWM signal by the smoothing circuit 74 (ENA smoothed voltage) is applied to a non-reverse input terminal of the operational amplifier OP. A collector of the transistor TR1 is connected to a base of a PNP-type transistor TR2 whose emitter is connected to the power source Vcc. The transistor TR2 constitutes the current control section 72. Thus, the operational amplifier OP of the differential amplifier 73 can control the driving current for the laser diode LD such that the "PWR smoothed voltage" approaches the "ENA smoothed voltage" by controlling the transistor TR2 via the transistor TR1. That is, the light power of the laser diode LD can be adjusted to the target light power by bringing the "PWR smoothed voltage" corresponding to the light power of the laser diode LD close to the "ENA smoothed voltage" corresponding to the target light power.

According to this embodiment, as described above, the voltage (pseudo voltage) corresponding to the monitor value obtained by subtracting a predetermined value from the reference set value is inputted as the "PWR smoothed voltage" at the startup, for example. Thus, light power overshoot of a laser beam caused at the startup is appropriately prohibited by the following method.

Figure 6:
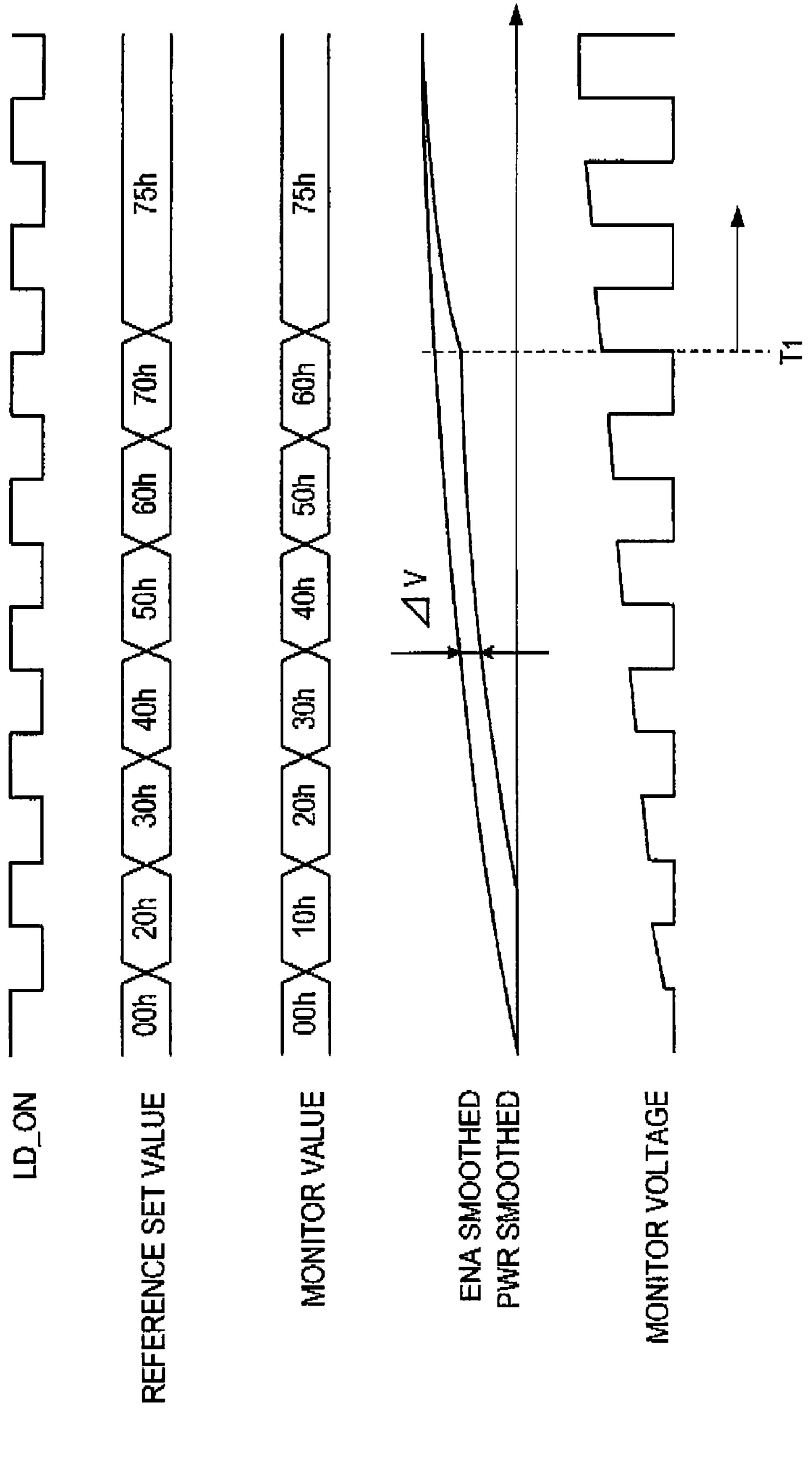
FIG. 6 is a time chart showing an operation of the control system.

For example, as illustrated in FIG. 6, when the start and power change calculation section 85 outputs a value 10 h ("h" indicates a hexadecimal number herein) smaller than the reference set value outputted from the PWM control section 83 as the pseudo voltage, the "PWR smoothed voltage" is lower than the "ENA smoothed voltage" by voltage of AV corresponding to the above value of 10 h at the time of startup, Thus, the differential amplifier 73 and the current control section 72 increase the energizing current for the laser diode LD. However, since the "PWR smoothed voltage" set as a pseudo value is not an extremely small value for the "ENA smoothed voltage", overshoot of energizing current for the laser diode LD is not caused for a value (target current) corresponding to a target light power.

After a time T1 when a deviation of an actual monitor voltage from a monitor voltage corresponding to the target light power (75 h in the case of FIG. 6) reaches a predetermined range (from 60 h to 90 h in the case of FIG. 6), the actual monitor voltage is inputted as the "PWR smoothed voltage". Thus, the monitor voltage can be appropriately converged at the reference set value, and the light power of the laser diode LD can be adjusted to the target light power in a short period of time. Thus, according to this embodiment, the condition of the laser printer 1 can be shifted to the condition ready for the image forming operation in an early stage.

Moreover, according to this embodiment, a value obtained by subtracting or adding a predetermined value (10 h in the case of FIG. 6) from or to a reference set value is used as a pseudo voltage. Thus, the operation of the laser printer 1 can be easily simulated in the following manner. When the voltage value of the "ENA smoothed voltage" is $V_{ENA}$, the voltage value of the "PWR smoothed voltage" is $V_{PWR}$, and the output of the operational amplifier OP is $V_{OUT}$ in the circuit shown in FIG. 5, the following equation holds:

$$V_{OUT}=(1+R2/R1)V_{ENA}\cdot(R2/R1)V_{PWR}$$

As described above, the pseudo value of $V_{PWR}$ is established by the equation of $V_{PWR}=V_{ENA}\cdot\Delta V$ at the startup, the $V_{OUT}$ is expressed by the following easy equation:

$$V_{OUT}=V_{ENA}+(R2/R1)\Delta V$$

Thus, the operation of the laser printer 1 can be easily simulated. Since the difference between the "ENA smoothed voltage" and the "PWR smoothed voltage" is kept constant, the monitor voltage can be appropriately converged even when the reference set value varies as shown in FIG. 6.

Obviously, many modifications and variations of the present invention are possible in light of the above teachings. It is therefore to be understood that within the scope of the appended claims, the present invention may be practiced otherwise than as specifically described herein.

For example, the ENA_PWM control section 83 may immediately output the reference set value corresponding to the target light power at the startup or change of the target light power. However, when the reference set value gradually approaches the value corresponding to the target light power as in the above embodiment, the light power of the laser beam can be adjusted more smoothly.

According to the above embodiment, the calculation selector 87 selects either the monitor voltage or the pseudo voltage as the monitor value to be used. However, instead of outputting the pseudo voltage by switching, a correction value or the like may be added to the monitor voltage and the resultant value of the correction may be outputted as the pseudo voltage. It is easier, however, to switch between the control by the pseudo voltage and the control by the monitor voltage when the calculation selector 87 is used as in the above embodiment.

The respective processes executed by the ASIC 80 and other components disclosed above may be all performed by software, or by an analog circuit instead of using digital values. However, when the PWM signals are produced from digital values and smoothed as in the above embodiment, a delay is caused at the time of smoothing and thus the advantage of prohibiting light power overshoot or light power undershoot may become more remarkable. In addition, the invention is applicable to various types of optical control apparatus as well as a laser printer.

What is claimed is:

1. An optical control apparatus, comprising:

a semiconductor laser that emits a laser beam having a power corresponding to an energizing current;

a light power detecting device that detects a light power of the laser beam;

a monitor voltage generating device that generates a monitor voltage set based on the light power detected by the light power detecting device;

a reference voltage generating device that generates a reference voltage set based on a target light power of the laser beam;

a current control device that controls the energizing current for the semiconductor laser such that the monitor voltage approaches the reference voltage based on a deviation of the monitor voltage from the reference voltage; and a pseudo voltage input device that inputs a predetermined pseudo voltage to the current control device instead of the monitor voltage under a predetermined condition such that a variation range of the deviation, caused by a change of the reference voltage between before and after a setting of the target light power, lies within a predetermined range.

2. The optical control apparatus according to claim 1, wherein:

the monitor voltage generating device generates a higher monitor voltage as the light power detected by the light power detecting device increases;

the reference voltage generating device generates a higher reference voltage as the target light power of the laser beam increases; and the pseudo voltage input device inputs a pseudo voltage set at a value lower than the reference voltage to the current control device instead of the monitor voltage at least at startup of the optical control apparatus.

3. The optical control apparatus according to claim 1, wherein, at least at a change of the target light power, the pseudo voltage input device inputs a pseudo voltage, set as a voltage between the reference voltage after the change of the target light power and the reference voltage before the change of the target light power, to the current control device instead of the monitor voltage.

4. The optical control apparatus according to claim 1, wherein the reference voltage generating device gradually changes the reference voltage such that the reference voltage approaches a voltage corresponding to the target light power.

5. The optical control apparatus according to claim 4, wherein the pseudo voltage input device gradually changes the pseudo voltage in accordance with a change of the reference voltage generated by the reference voltage generating device.

6. The optical control apparatus according to claim 1, wherein the pseudo voltage input device includes:

a pseudo voltage generating device that generates the pseudo voltage.

7. The optical control apparatus according to claim 1, wherein the pseudo voltage input device includes:

a selecting device that selectively inputs either the pseudo voltage or the monitor voltage to the current control device.

8. The optical control apparatus according to claim 7, wherein the selecting device inputs the monitor voltage to the current control device when the deviation of the monitor voltage from the reference voltage lies within a predetermined range.

9. The optical control apparatus according to claim 7, wherein the selecting device inputs the pseudo voltage to the current control device when the deviation of the monitor voltage from the reference voltage is out of a predetermined range.

10. The optical control apparatus according to claim 1, further comprising:

a scanning device that deflects the laser beam and scans by the laser beam; and a BD detecting device that detects an origin of scan by the laser beam.

11. The optical control apparatus according to claim 10, wherein the monitor voltage is inputted to the current control device when the BD detecting device detects the laser beam.

12. The optical control apparatus according to claim 1, wherein the reference voltage generating device includes:

a rectangular wave generating device that generates rectangular waves corresponding to the reference voltage; and a smoothing device that smoothes the rectangular waves generated by the rectangular wave generating device.

13. The optical control apparatus according to claim 1, wherein the pseudo voltage input device includes:

a rectangular wave generating device that generates rectangular waves corresponding to the pseudo voltage; and a smoothing device that smoothes the rectangular waves generated by the rectangular wave generating device.

14. The optical control apparatus according to claim 1, wherein the pseudo voltage is set at a value obtained by subtracting a predetermined value from the reference voltage.

15. The optical control apparatus according to claim 1, wherein the pseudo voltage is set at a value obtained by adding a predetermined value to the reference voltage.

16. The optical control apparatus according to claim 1, wherein, at least at a change of the target light power, the pseudo voltage input device inputs a pseudo voltage, set as a voltage obtained by adding a predetermined value to the reference voltage after the change of the target light power, to the current control device instead of the monitor voltage.

17. The optical control apparatus according to claim 1, wherein, at least at a change of the target light power, the pseudo voltage input device inputs a pseudo voltage, set as a voltage obtained by subtracting a predetermined value from the reference voltage after the change of the target light power, to the current control device instead of the monitor voltage.

* * * * *